(12) United States Patent
Mizokuchi

(10) Patent No.: US 7,518,186 B2
(45) Date of Patent: Apr. 14, 2009

(54) VERTICAL GATE SEMICONDUCTOR DEVICE AND METHOD FOR MANUFACTURING THE SAME

(75) Inventor: Shuji Mizokuchi, Niigata (JP)

(73) Assignee: Panasonic Corporation, Osaka (JP)

( * ) Notice: Subject to any disclaimer, the term of this patent is extended or adjusted under 35 U.S.C. 154(b) by 40 days.

(21) Appl. No.: 11/819,784

(22) Filed: Jun. 29, 2007

(65) Prior Publication Data
US 2008/0012069 A1 Jan. 17, 2008

(30) Foreign Application Priority Data
Jul. 12, 2006 (JP) .............................. 2006-191472
Apr. 23, 2007 (JP) .............................. 2007-112796

(51) Int. Cl.
*H01L 29/94* (2006.01)
(52) U.S. Cl. ..................... 257/330; 257/331; 257/332; 257/333; 257/334
(58) Field of Classification Search ................. 257/330, 257/331, 332, 333, 334
See application file for complete search history.

(56) References Cited

U.S. PATENT DOCUMENTS 4,767,722 A    8/1988   Blanchard

2003/0080378 A1   5/2003   Zundel et al.
2005/0093060 A1   5/2005   Murakami
2005/0179082 A1   8/2005   Miyata et al.
2006/0124996 A1   6/2006   Mizokuchi et al.

FOREIGN PATENT DOCUMENTS

JP    2662217    6/1997

OTHER PUBLICATIONS

Extended European Search Report, issued in European Patent Application No. 07111017.5-2203, dated on Mar. 19, 2008.

*Primary Examiner*—Evan Pert
*Assistant Examiner*—Tan N Tran
(74) *Attorney, Agent, or Firm*—McDermott Will & Emery LLP

(57) ABSTRACT

A gate electrode is buried in a trench passing through a second conductivity type first body region formed on a first conductivity type drain region so as to form a recessed portion at the upper part of the trench. An insulating film is formed on the gate electrode so as to occupy the recessed portion partway. A first conductivity type source region is formed in at least a region of the upper part of the first body region which serves as at least the wall part of the trench. A second conductivity type second body region is formed in the other region of the upper part thereof so as to be adjacent to the source region in the direction that the trench extends. A second conductivity type third body region is formed in the respective upper parts of the source region and the second body region.

8 Claims, 8 Drawing Sheets

VERTICAL GATE SEMICONDUCTOR DEVICE AND METHOD FOR MANUFACTURING THE SAME

FIELD OF THE INVENTION

The present invention relates to a semiconductor device including a vertical gate electrode and a method for manufacturing it.

BACKGROUND ART

Recently, in association with reduction in power consumption and increases in performance and speed of electronic appliances, low-power-consumption and high-speed semiconductor devices for them are demanded. In general, in order to address such a demand, semiconductor devices used in DC-DC converters of electronic appliances are required to include transistors having small ON resistance. One of methods for reducing the ON resistance of the transistors is to increase the density of the transistors arranged per unit area. Specifically, gate electrodes are arranged vertically in a semiconductor device. In the vertical gate semiconductor device in which the gate electrodes are arranged vertically, a source region and a body region are provided so as to be opposed to the upper part of the gate electrodes, and a drain region is provided so as to be opposed to the bottom of the gate electrodes.

In the case where the gate electrodes are arranged vertically, however, the uppermost faces of the vertical gate electrodes are aligned with the surface of the silicon substrate in which the source region and the body region are provided. For this reason, in connecting the electrodes to the source region or the body contact region, it is required to prevent conduction between the gate electrode and the source region or the body contact region by covering the upper part of the vertical gate electrode with a convex insulating film.

For satisfying this requirement, there has been proposed a method of manufacturing a vertical gate semiconductor device including a plurality of vertical gate electrodes arranged in parallel in which the uppermost faces of the vertical gate electrodes are recessed lower than the surface of the silicon substrate in which the source region and the body region are formed and an insulating film is filled in the recessed portion above each vertical gate electrode so that the uppermost face of the insulating film is aligned with the surface of the silicon substrate in which the source region and the body region are formed. According to this method, the vertical gate electrodes can be insulated from the source region and the body contact region without covering the upper part of each vertical gate electrodes with the convex insluting film.

A conventional vertical gate semiconductor device and a method of manufacturing it disclosed in Japanese Patent Publication No. 2662217B will be described below with reference to FIG. 19.

In the vertical gate semiconductor device shown in FIG. 19, a first conductivity type drain region 20 formed of an epitaxial layer and a second conductivity type body region 21 are formed in this order on a first conductivity type silicon substrate 19. Trenches 31 are formed so as to pass through the body region 21, and a vertical gate electrode 23 is formed in each trench 31 with an insulting material layer (a gate insulating film) 22 interposed. The vertical gate electrodes 23 are formed so as to form recessed portions in the upper parts of the trenches 31, wherein an insulating film 26 is filled in each recessed portion. A first conductivity type source region 25 is formed in the upper part of the body region 21 in the vicinity of the trenches 31 while a second conductivity type body contact region 24 is formed in a region of the upper part of the body region 21 which is adjacent to the source region 25. Hereinafter, a combination of the silicon substrate 19, the drain region 20, the body region 21, the body contact region 24, and the source region 25 is referred to as a semiconductor substrate 30. The uppermost faces of the vertical gate electrodes 23 are located lower than the surface of the semiconductor substrate 30 in which the source region 25 and the like are formed. Further, an aluminum layer 28 to be a wiring layer is formed on the semiconductor substrate 30 including the insulating film 26 with a barrier metal 27 interposed so that the wiring layer is in electrical contact with the body contact region 24 and the source region 25.

In the vertical gate semiconductor device shown in FIG. 19, the drain region 20, the body region 21, and the source region 25 are in contact with the insulating material layers 22 at the perpendicular wall faces of the trenches 31. Further, the vertical gate electrodes 23 are opposed at the upper parts thereof to the source region 25 while being opposed at the bottoms thereof to the drain region 20.

As described above, the vertical gate semiconductor device shown in FIG. 19 is a semiconductor device in which the uppermost surface of the insulating film 26 filled in the recessed portion above each vertical gate electrode 23 is aligned substantially with the surface of the semiconductor substrate 30 in which the source region 25 and the like are formed. Employment of this structure enables a masking process to be performed on the thus formed flat surface, facilitating manufacture of the semiconductor device.

SUMMARY OF THE INVENTION

In the above conventional vertical gate semiconductor device, however, if the distance between the adjacent trench gate electrodes would become small in association with future progress in miniaturization, the widths of the source region and the body region would become small accordingly. As a result, the contact area between the source region and the body region becomes small, presenting a disadvantage that connection resistance with a wiring material increases.

In view of the foregoing, the present invention has its object of attaining a vertical gate semiconductor device in which the area of a contact part between a body region and a wiring layer is increased with no reduction in area of a contact part between a source region and the wiring layer invited.

To attain the above object, the prevent inventors tried forming a gate electrode so as to form a recessed portion in the upper part of the trench and forming an insulating film on the gate electrode so as to occupy the recessed portion partway to thus accomplish an invention that the contact part between the source region and the wiring layer is set at the wall face of the trench while the contact part (a body contact region) between the body region and the wiring layer is set at the wall face of the trench and the upper face of the substrate. The present inventors accomplished an additional invention that the upper corner of the wall part of the trench is rounded in order to suppress generation of a void in the recessed portion serving as the contact part in filling a wiring material.

Specifically, the vertical gate semiconductor device according to the present invention includes: a first conductivity type drain region formed on a substrate; a second conductivity type first body region provided on the drain region; a trench formed so as to pass through the first body region; a gate electrode formed in the trench with a gate insulting film interposed so as to form a recessed portion at an upper part of the trench; an insulating film formed on the gate electrode so as to occupy the recessed portion partway; a first conductivity type source region formed in at least a region of an upper part of the first body region which serves as a wall part of the trench so as to overlap in level with at least an upper part of the gate electrode; a second conductivity type second body region formed in a region of the upper part of the first body region other than the at least region thereof so as to be adjacent to the source region in a direction that the trench extends; a second conductivity type third body region formed in respective upper parts of the source region and the second body region; and a wiring layer in contact with the source region, the second body region, and the third body region. In the vertical gate semiconductor device, the source region, the second body region, and the third body region reach a wall face of the trench, the upper face of the insulating film is lower than respective upper faces of the source region and the second body region, and the wiring layer is formed so as to cover the upper face of the third body region and a part of the wall face of the trench which is upper in level than the insulating film, at which the wiring layer is in contact with the source region, the second body region, and the third body region.

According to the vertical gate semiconductor device of the present invention, the source region and the wiring layer can be in contact with each other at a part of the wall face of the trench, and the body region and the wiring layer can be in contact with each other at a part of the wall face of the trench and the upper face (the entire upper face, if necessary) of the substrate. As a result, the contact resistance between the body region and the wiring layer can be reduced remarkably with no increase in contact resistance between the source region and the wiring layer invited. Hence, generation of potential difference within the body region in transistor operation can be suppressed with no increase in ON resistance involved, thereby preventing a parasitic bipolar transistor from operating.

In the vertical gate semiconductor device of the present invention, preferably, the upper corner of the wall part of the trench is rounded. Optionally, the vertical gate semiconductor device may further includes an additional trench passing through the first body region and formed in parallel with the trench, wherein the source region, the second body region, and the third body region are formed between the trench and the additional trench, and between the trench and the additional trench, a layered structure formed of the source region and the third body region and a layered structure formed of the second body region and the third body region each have a convex form of which top is rounded. Herein, the term "rounded" implies provision of at least one flat face or curved face that connects between a perpendicular face and a horizontal face of a target structure.

With the above structure, a void is prevented from being generated in filling a wring material into the recessed portion formed to serve as the contact part at the upper part of the trench, increasing the coverage of the wiring layer to thus lower the contact resistance and the ON resistance (low Ron).

As described above, when the present invention is applied to a semiconductor device including a vertical gate electrode and a method for manufacturing it, the area of the contact part between the body region and the wiring layer increases with no reduction in area of the contact part between the source region and the wiring layer invited, and therefore, the present invention is very useful.

DESCRIPTION OF THE PREFERRED EMBODIMENT

Embodiment

Figure 1:
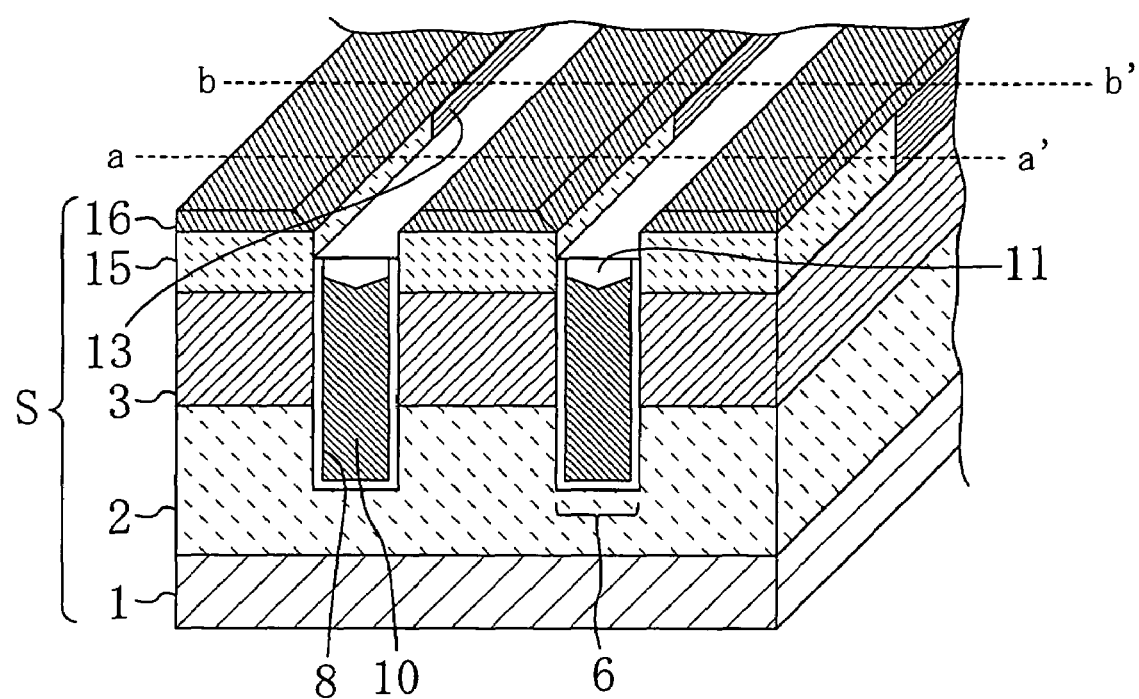
FIG. 1 is a bird's eye view of a vertical gate semiconductor device according to one embodiment of the present invention.
Figure 2A:
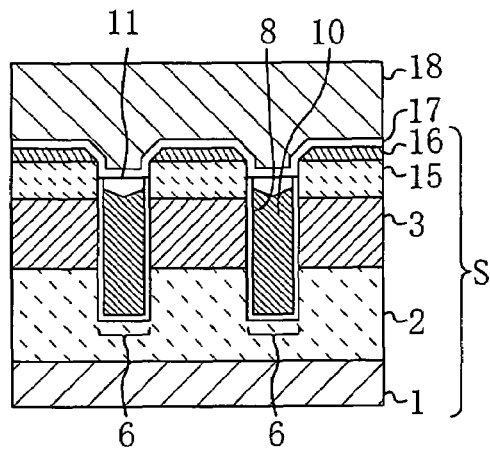
FIG. 2A and FIG. 2B are sectional views taken along the lines a-a' and b-b' in FIG. 1, respectively.
Figure 2B:
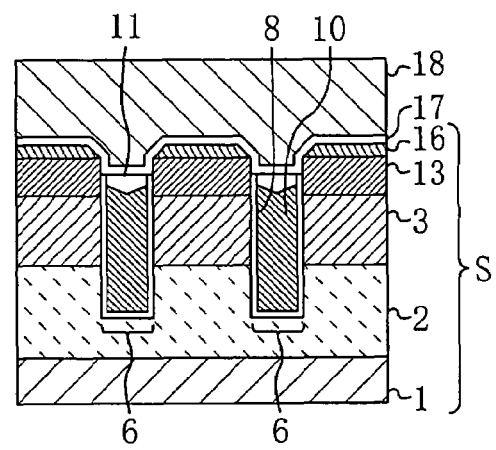

A vertical gate semiconductor device and a method for manufacturing it according to one embodiment of the present invention will be described with reference to the accompanying drawings. FIG. 1 is a bird's eye view of the semiconductor device according to the present embodiment. FIG. 2A and FIG. 2B are sectional views taken along the lines a-a' and b-b' in FIG. 1, respectively. In FIG. 1, a wiring layer, which will be described later, is omitted.

As shown in FIG. 1, FIG. 2A, and FIG. 2B, a first conductivity type epitaxial region 2 serving as a drain region is formed on a first conductivity type silicon substrate 1. On the epitaxial region 2, a first body region 3 is formed which has second conductivity opposite the first conductivity. Wherein, the first body region 3 is formed by performing at least twice implantation of a second conductivity type impurity. A plurality of trenches 6 are formed in parallel with each other so as to pass through the first body region 3. A gate electrode 10 is formed in each trench 6 with a gate insulating film 8 interposed so as to form a recessed portion at the upper part of each trench 6, and an insulting film 11 is formed on each gate electrode 10 so as to occupy the recessed portion partway. A first conductivity type source region 15 is formed in at least a region of the upper part of the first body region 3 which serves as a wall part of each trench 6 so as to overlap in level with at least the upper part of the gate electrode 10. Wherein, the source region 15 is formed by performing at least twice implantation of a first conductivity type impurity. In the other region of the upper part of the first body region 3, a second conductivity type second body region 13 is formed so as to be adjacent to the source region 15 in the direction that the trenches 6 extend. Wherein, the second body region 13 is formed by performing at least twice implantation of a second conductivity type impurity. Further, a ratio of a layout area of the second body region 13 to that of the source region 15 on the principal surface of the substrate is 2:1, for example. A second conductivity type third body region 16 is formed in the respective upper parts of the source region 15 and the second body region 13. Herein, the source region 15, the second body region 13, the third body region 16 are formed so as to reach each wall face of the trenches 6, that is, the insulting film 8. Further, the third body region 16 covers a part of the source region 15 which is a part other than a part in contact with a wiring layer, which will be described later.

Hereinafter, a combination of the silicon substrate 1, the drain region 2, the first body region 3, the source region 15, the second body region 13, and the third body region 16 is referred to as a semiconductor substrate S. The upper face of the insulating film 11 in each trench 6 is located lower than the surface of the semiconductor substrate S in which the source region 15 and the like are formed, more specifically, is lower than the upper faces of the source region 15 and the second body region 13. Further, an aluminum film 18 to be the wiring layer is formed on the semiconductor substrate S including each recessed portion above the insulating film 11 with a barrier metal film 17 interposed so that the wiring layer is in electrical contact with the source region 15, the second body region 13, and the third body region 16. In other words, the aluminum film 18 to be the wiring layer is formed so as to cover the upper face of the third body region 16 and a part of the wall face of each trench 6 which is located above the insulating film 11, so that the wiring layer is in electric contact with the source region 15, the second body region 13, and the third body region 16.

As described above, according to the present embodiment, the source region 15 and the wiring layer can be in contact with each other at parts of the wall faces of the trenches 6, and the body regions 13 and 16 and the wiring layer can be in contact with each other at parts of the wall faces of the trenches 6 and at the upper face of the semiconductor substrate S, that is, the upper face of the third body region 16 (the entire face thereof, if necessary). Accordingly, the contact resistance between the body regions 13 and 16 and the wiring layer can be reduced remarkably with no increase in contact resistance between the source region 15 and the wiring layer invited. Hence, generation of potential difference in the body regions in transistor operation can be suppressed with no increase in ON resistance involved, preventing a parasitic bipolar transistor from operating.

Moreover, in the present embodiment, as shown in FIG. 1, FIG. 2A, and FIG. 2B, the upper corners of the wall parts of the trenches 6 are rounded, so that a void is prevented from being generated in filling a wiring material into the recessed portions formed to serve as the contact parts at the upper parts of the trenches 6, increasing the coverage of the wiring layer to reduce the contact resistance and the ON resistance (low Ron).

In the present embodiment, the source region 15 is formed by performing at least twice implantation of the first conductivity type impurity so as to have impurity profiles formed by the respective implantation of which peak points in the depth direction are different from each other, resulting in formation of the source region 15 having low resistance and less concentration variation in the perpendicular direction to the surface of the substrate.

Furthermore, in the present embodiment, the first body region 3 and the second body region 13 are formed by performing at least twice implantation of the second conductivity type impurity so as to have impurity profiles formed by the respective implantation of which peak points in the depth direction are different from each other, resulting in formation of the body regions 3, 13 with less concentration variation in the perpendicular direction to the surface of the substrate.

In the present embodiment, the ratio of the layout area of the second body region 13 to that of the source region 15 is set to a predetermined value on the principal surface of the substrate, so that the operation of a parasitic bipolar transistor can be suppressed. Though the ratio is set to 2:1 in the present embodiment, the operation of the bipolar transistor can be suppressed as far as the ratio is increased to approximately 5:1. In the case where lowering of the source resistance is contemplated more than suppression of the operation of a parasitic bipolar transistor, the ratio may be reduced to approximately 1:5.

It is noted that in the present embodiment, the drain region formed of the epitaxial region 2 has a breakdown voltage between approximately 8 V and approximately 100 V.

Figure 3A:
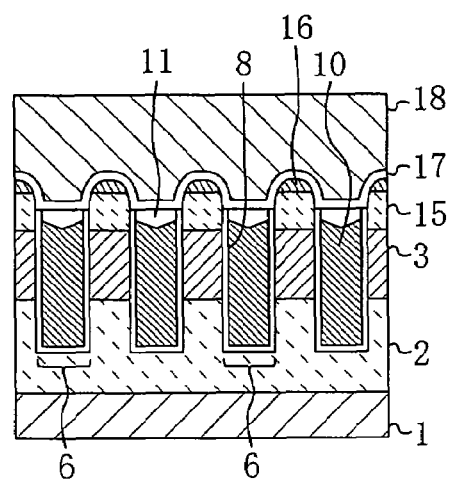
FIG. 3A and FIG. 3B are sectional views of a vertical gate semiconductor device according to a modified example which are replaceable by the sectional structures shown in FIG. 2A and FIG. 2B, respectively.
Figure 3B:
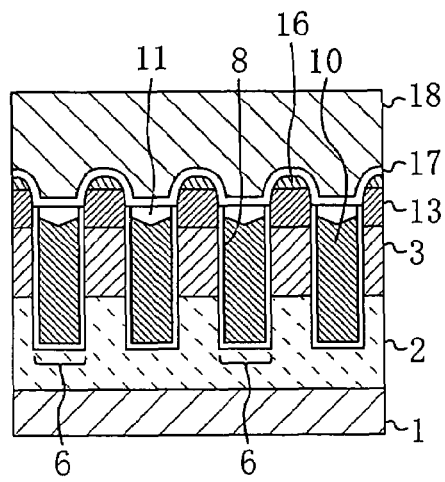

FIG. 3A and FIG. 3B show sectional structures of a semiconductor device according to a modified example of the present embodiment which are replaceable by the sectional structures shown in FIG. 2A and FIG. 2B, respectively. Differences of the sectional structures shown in FIG. 3A and FIG. 3B from the sectional structures shown in FIG. 2A and FIG. 2B lie in that the trenches 6 are formed at a narrower pitch and that a layered structure formed of the source region 15 and the third body region 16 and a layered structure formed of the second body region 13 and the third body region 16 between the trenches 6 each have a convex form of which top is rounded. The same effects as those in the present embodiment shown in FIG. 1, FIG. 2A, and FIG. 2B can be obtained in the semiconductor device having the sectional structures shown in FIG. 3A and FIG. 3B.

The method for manufacturing the semiconductor device according to the present embodiment shown in FIG. 1, FIG. 2A, and FIG. 2B will be described with reference to FIG. 4A, FIG. 4B, FIG. 5A, FIG. 5B, FIG. 6A, FIG. 6B, FIG. 7A, FIG. 7B, FIG. 8A, FIG. 8B, FIG. 9A, FIG. 9B, FIG. 10A, FIG. 10B, FIG. 11A, FIG. 11B, FIG. 12A, FIG. 12B, FIG. 13A, FIG. 13B, FIG. 14A, FIG. 14B, FIG. 15A, FIG. 15B, FIG. 16A, FIG. 16B, FIG. 17A, FIG. 17B, FIG. 18A, and FIG. 18B. Wherein, FIG. 4A, FIG. 5A, FIG. 6A, FIG. 7A, FIG. 8A, FIG. 9A, FIG. 10A, FIG. 11A, FIG. 12A, FIG. 13A, FIG. 14A, FIG. 15A, FIG. 16A, FIG. 17A, and FIG. 18A are sectional views of a structure in respective steps corresponding to the sectional structure shown in FIG. 2A, and FIG. 4B, FIG. 5B, FIG. 6B, FIG. 7B, FIG. 8B, FIG. 9B, FIG. 10B, FIG. 11B, FIG. 12B, FIG. 13B, FIG. 14B, FIG. 15B, FIG. 16B, FIG. 17B, and FIG. 18B are sectional view of a structure in respective steps corresponding to the sectional structure shown in FIG. 2B.

Figure 4A:
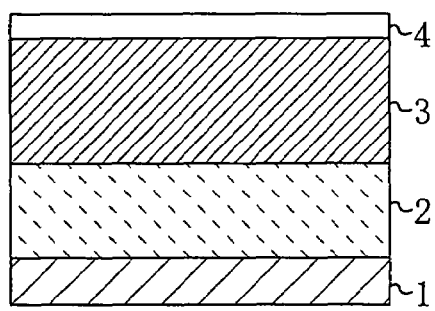
FIG. 4A and FIG. 4B are sectional views showing a step of a method for manufacturing the vertical gate semiconductor device according to the embodiment of the present invention.
Figure 4B:
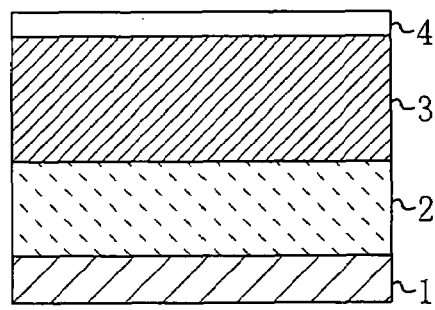
Figure 5A:
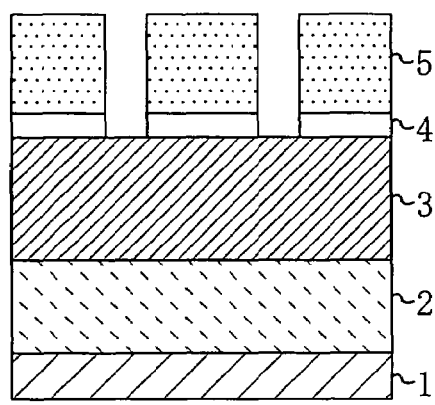
FIG. 5A and FIG. 5B are sectional views showing a step of the method for manufacturing the vertical gate semiconductor device according to the embodiment of the present invention.
Figure 5B:
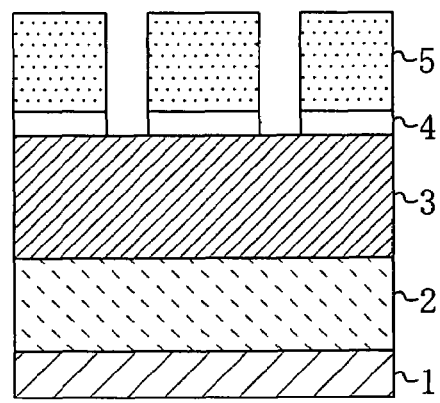
Figure 6A:
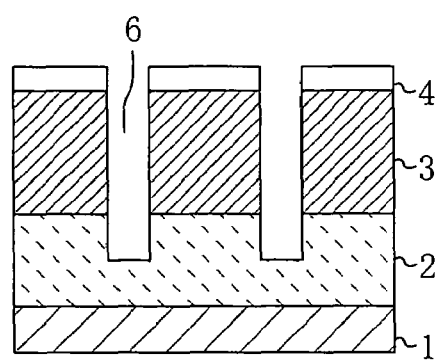
FIG. 6A and FIG. 6B are sectional views showing a step of the method for manufacturing the vertical gate semiconductor device according to the embodiment of the present invention.
Figure 6B:
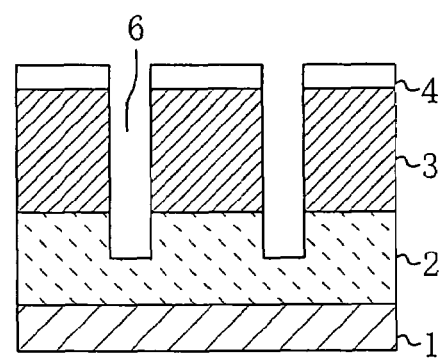

First, as shown in FIG. 4A and FIG. 4B, after the first conductivity type epitaxial region 2 serving as the drain region is formed on the first conductivity type silicon substrate 1, the first body region 3 having the second conductivity opposite the first conductivity is formed on the epitaxial region 2, and then, a silicon oxide film 4 having a thickness of, for example, 50 to 500 nm is grown on the first body region 3 by, for example, thermal oxidation. Wherein, the first body region 3 is formed by performing at least twice implantation of a second conductivity type impurity. Then, the silicon oxide film 4 is etched with the use of a resist pattern 5, as shown in FIG. 5A and FIG. 5B, and the first body region 3 and the epitaxial region 2 are subjected to dry etching using the patterned silicon oxide film 4 as a mask to form a plurality of trenches 6 having a depth of 0.8 to 3.0 µm in parallel with each other so as to pass through the first body region 3 and reach the epitaxial region 2, as shown in FIG. 6A and FIG. 6B.

Figure 7A:
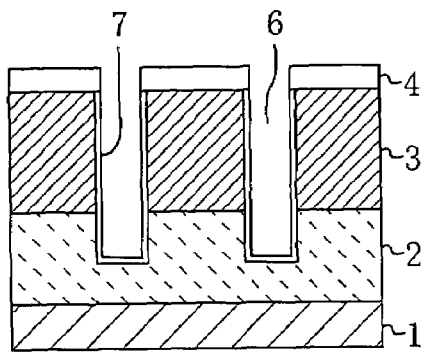
FIG. 7A and FIG. 7B are sectional views showing a step of the method for manufacturing the vertical gate semiconductor device according to the embodiment of the present invention.
Figure 7B:
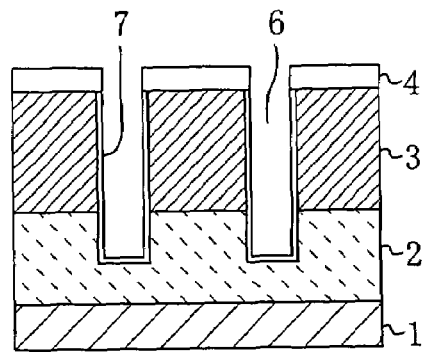
Figure 8A:
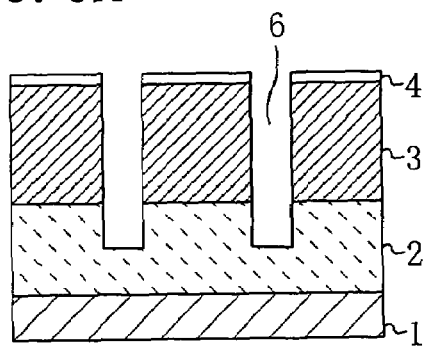
FIG. 8A and FIG. 8B are sectional views showing a step of the method for manufacturing the vertical gate semiconductor device according to the embodiment of the present invention.
Figure 8B:
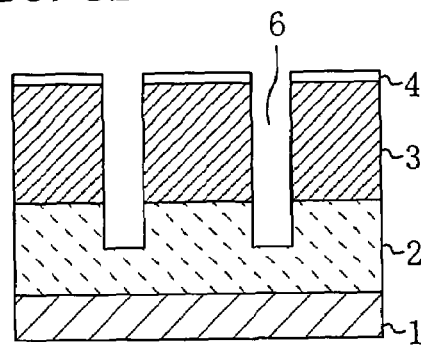
Figure 9A:
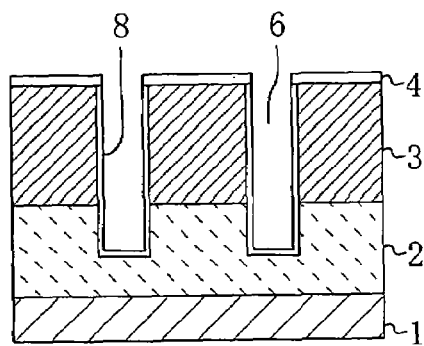
FIG. 9A and FIG. 9B are sectional views showing a step of the method for manufacturing the vertical gate semiconductor device according to the embodiment of the present invention.
Figure 9B:
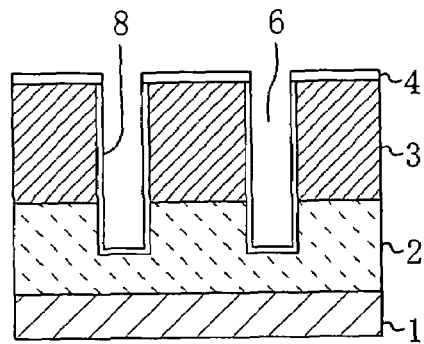

Subsequently, as shown in FIG. 7A and FIG. 7B, in order to minimizing damage at the upper corners, the bottoms, and the wall faces of the trenches 6, a silicon oxide film 7 having a thickness of, for example, 20 to 100 nm is grown at the bottoms and the wall faces of the trenches 6 by, for example, thermal oxidation. Then, as shown in FIG. 8A and FIG. 8B, the silicon oxide film 7 once formed is removed by wet etching. In this wet etching, the silicon oxide film 4 on the first body region 3 is removed partially, as well. Then, the gate insulating film 8 formed of a silicon oxide film and having a thickness of, for example, 8 to 10 nm is grown on the bottoms and the wall faces of the trenches 6, as shown in FIG. 9A and FIG. 9B.

Figure 10A:
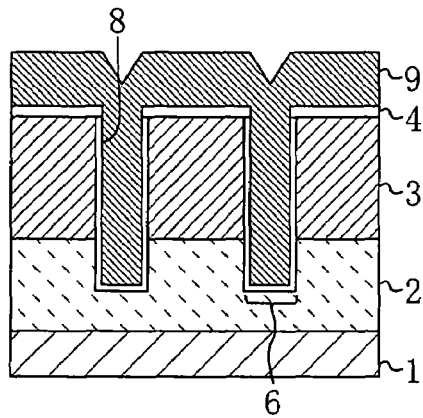
FIG. 10A and FIG. 10B are sectional views showing a step of the method for manufacturing the vertical gate semiconductor device according to the embodiment of the present invention.
Figure 10B:
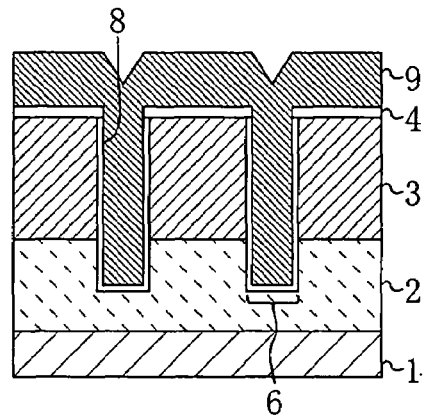
Figure 11A:
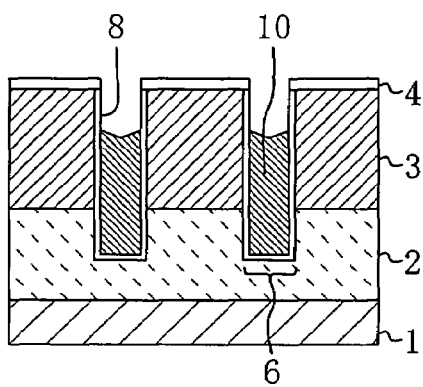
FIG. 11A and FIG. 11B are sectional views showing a step of the method for manufacturing the vertical gate semiconductor device according to the embodiment of the present invention.
Figure 11B:
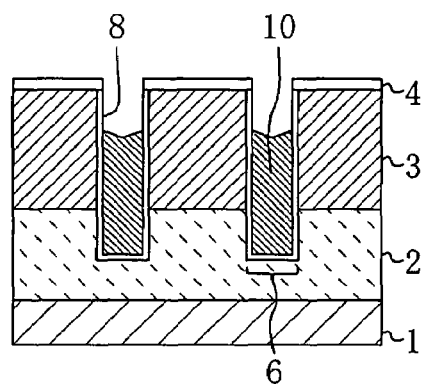

Next, after a polysilicon film 9 as a gate electrode material having a thickness of, for example, 200 to 800 nm is deposited on the entire face of the substrate S including the inside of each trench 6, as shown in FIG. 10A and FIG. 10B, etching is performed on the entire face of the polysilicon film 9, as shown in FIG. 11A and FIG. 11B. Wherein, etching is performed so that the uppermost face of the etched polysilicon film 9 at the inside of each trench 6 is recessed, for example, 200 to 800 nm lower than the surface of the silicon oxide film 4 remaining on the first body region 3. This forms each gate electrode 10 in each trench 6 with the gate insulating film 8 interposed while forming the recessed portion at the upper part of each trench 6.

Figure 12A:
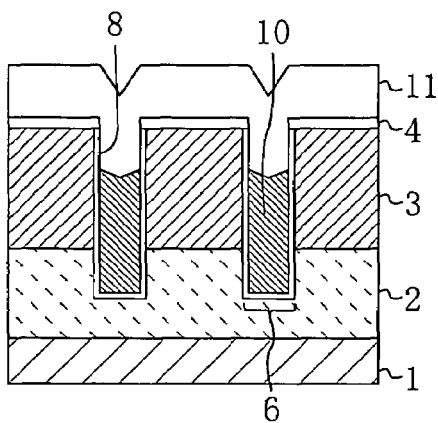
FIG. 12A and FIG. 12B are sectional views showing a step of the method for manufacturing the vertical gate semiconductor device according to the embodiment of the present invention.
Figure 12B:
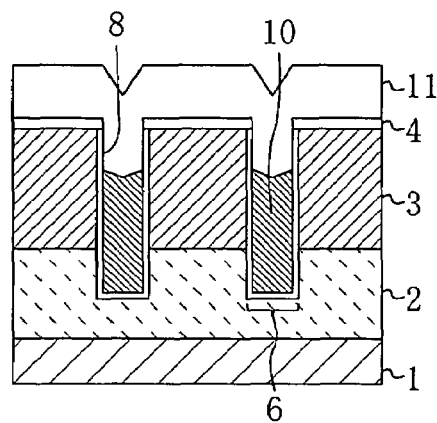
Figure 13A:
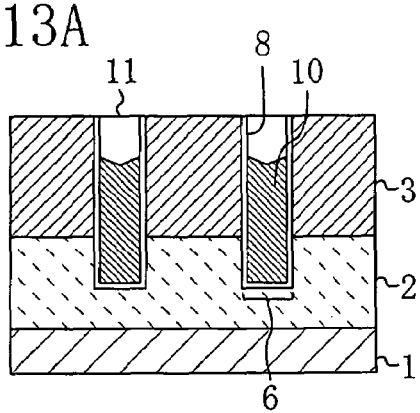
FIG. 13A and FIG. 13B are sectional views showing a step of the method for manufacturing the vertical gate semiconductor device according to the embodiment of the present invention.
Figure 13B:
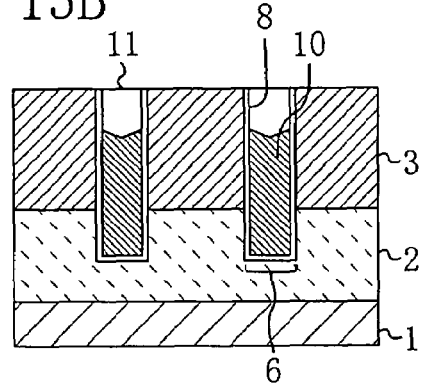

Following formation of the gate electrodes 10, the insulating film 11 formed of a silicon oxide film having a thickness of, for example, 200 to 1000 nm is deposited on the entire face of the substrate S including the inside of each recessed portion, as shown in FIG. 12A and FIG. 12B, and then, the insulating film 11 is etched back for flattening, as shown in FIG. 13A and FIG. 13B, to align the upper face of the etched insulating film 11 to the surface of the first body region 3. Thus, the insulating film 11 is filled in the recessed portion at the upper part of each trench 6 after formation of the gate electrodes 10. In filing the insulating film 11, an interlayer insulting film is formed in wiring parts around the transistor cells including the gate electrodes 10 in such a manner that the insulating film 11 is left by being covered with a resist pattern.

Figure 14A:
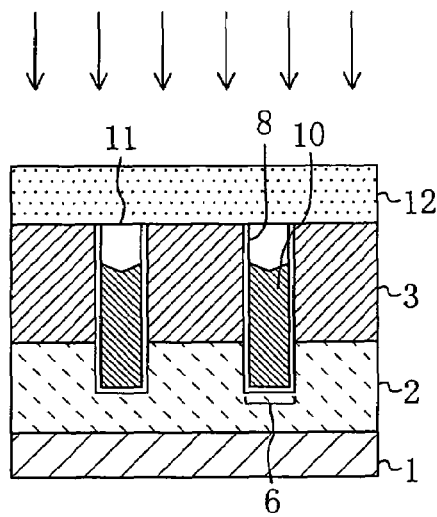
FIG. 14A and FIG. 14B are sectional views showing a step of the method for manufacturing the vertical gate semiconductor device according to the embodiment of the present invention.
Figure 14B:
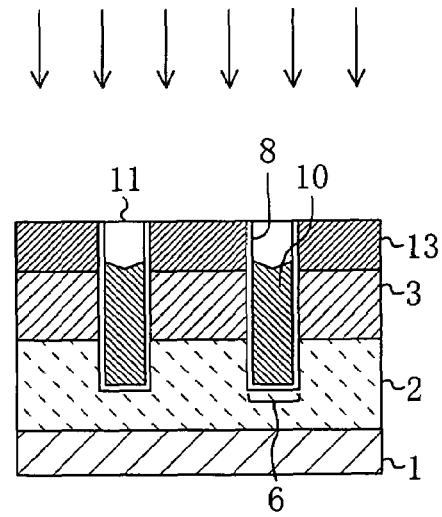
Figure 15A:
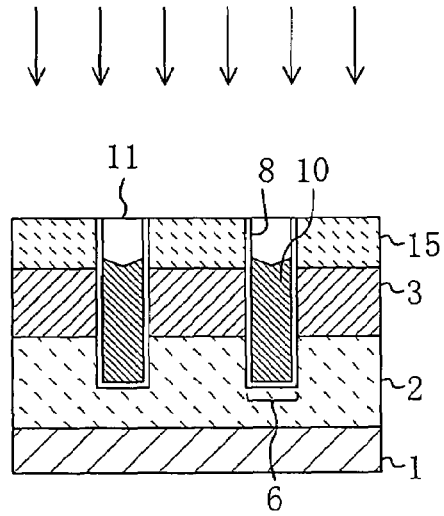
FIG. 15A and FIG. 15B are sectional views showing a step of the method for manufacturing the vertical gate semiconductor device according to the embodiment of the present invention.
Figure 15B:
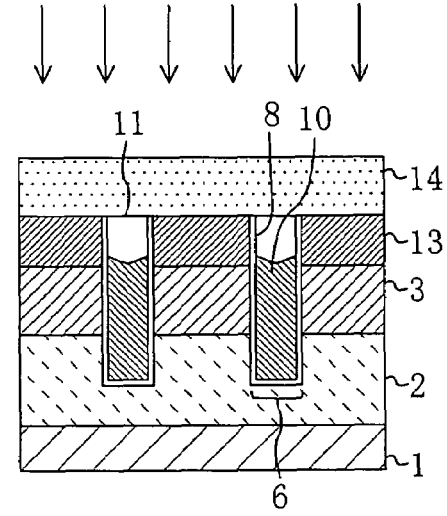

Thereafter, as shown in FIG. 14A and FIG. 14B, a second conductivity type impurity is implanted into the upper part of the first body region 3 with the use of a resist pattern 12 that covers a source formation region to form the second body region 13. Wherein, the second body region 13 is formed by performing at least twice implantation of the second conductivity type impurity. Then, as shown in FIG. 15A and FIG. 15B, a first conductivity type impurity is implanted into the upper part of the first body region 3 with the use of a resist pattern 14 that covers the second body region 13 (a resist pattern in reverse to the resist pattern 12) to form the source region 15. Herein, the source region 15 is formed by performing at least twice implantation of the first conductivity type impurity. Further, the source region 15 is formed in at least a region of the upper part of the first body region 3 which serves as the wall parts of the trenches 6 so as to overlap in level with at least the upper parts of the gate electrodes 10. Further, the second body region 13 is formed in the other region of the upper part of the first body region 3 so as to be adjacent to the source region 15 in the direction that the trenches 6 extend. It is noted that the sequence of the step of forming the source region 15 and the step of forming the second body region 13 may be altered.

Figure 16A:
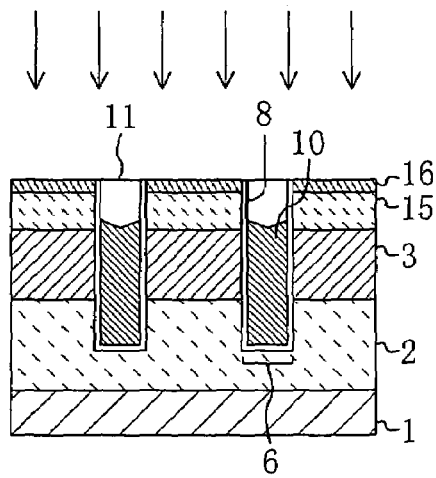
FIG. 16A and FIG. 16B are sectional views showing a step of the method for manufacturing the vertical gate semiconductor device according to the embodiment of the present invention.
Figure 16B:
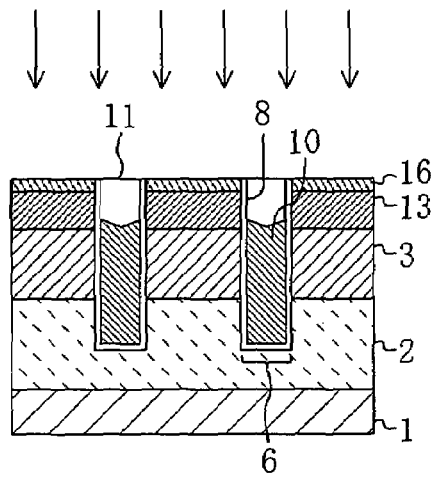

Subsequently, as shown in FIG. 16A and FIG. 16B, a second conductivity type impurity is implanted into the entire face of the substrate S to form the second conductivity type third body region 16 in the respective upper parts of the source region 15 and the second body region 13. It is noted that the ion implantation step shown in FIG. 16A and FIG. 16B may be omitted when establishing electric contact between the below-described wiring layer and the source region and between the wiring layer and the body region only at the wall faces of the trenches.

Figure 17A:
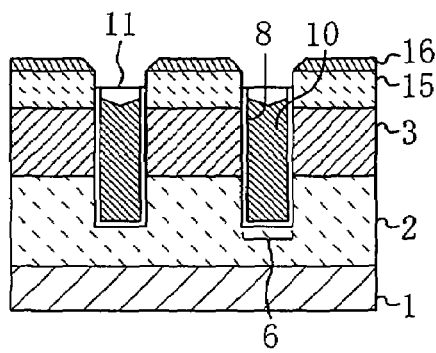
FIG. 17A and FIG. 17B are sectional views showing a step of the method for manufacturing the vertical gate semiconductor device according to the embodiment of the present invention.
Figure 17B:
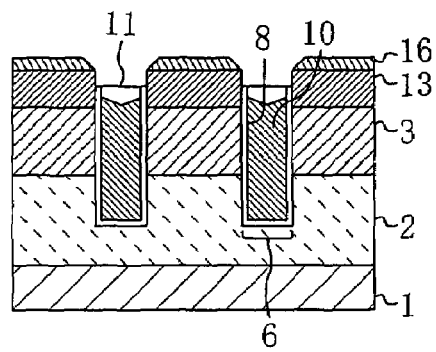

Next, as shown in FIG. 17A and FIG. 17B, dry etching is performed on the entire face of the substrate S to cause etch back at the insulating film 11 filled in the recessed portion of each gate electrode 10, thereby forming contact holes. This allows the source region 15, the second body region 13, and the third body region 16 to be exposed at the wall faces of the trenches 6. Specifically, the insulating film 11 filled in the recessed portion above each gate electrode 10 is etched by the thickness of, for example, 100 to 300 nm to form the recessed contact holes above the trenches 6, and at the same time, the upper corners of the wall parts of the trenches 6 are rounded, as shown in FIG. 17A and FIG. 17B.

Figure 18A:
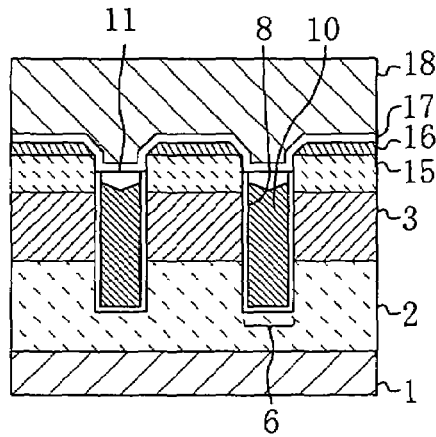
FIG. 18A and FIG. 18B are sectional views showing a step of the method for manufacturing the vertical gate semiconductor device according to the embodiment of the present invention.
Figure 18B:
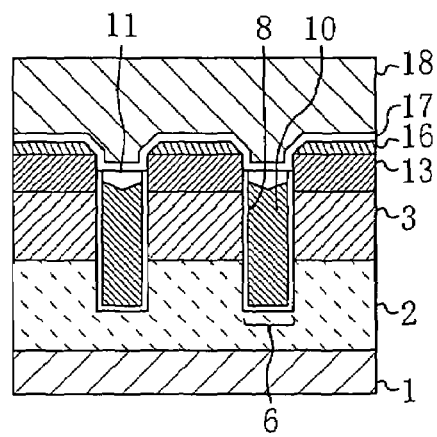
Figure 19:
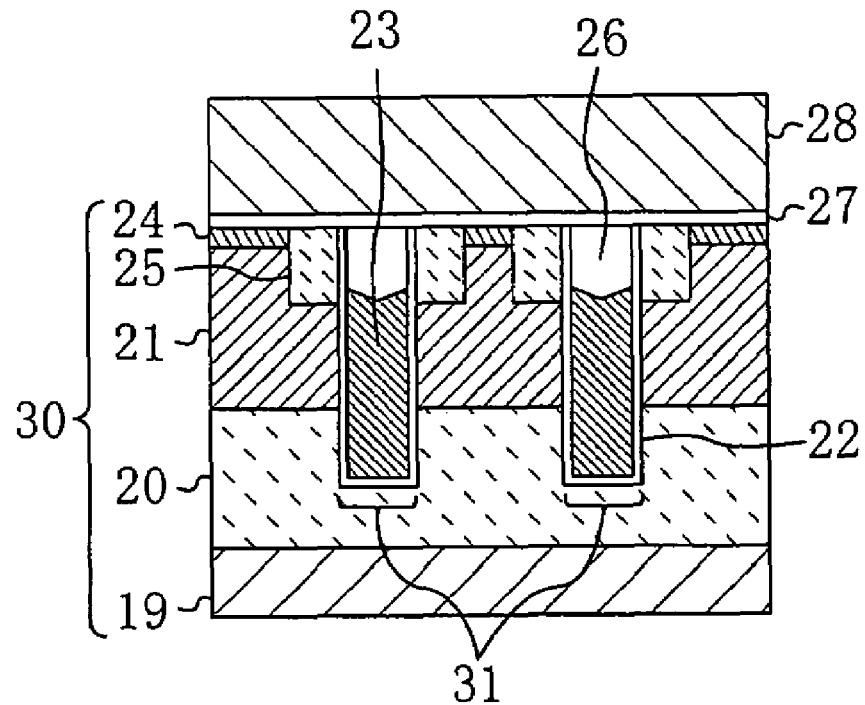
FIG. 19 is a sectional view of a conventional semiconductor device.

Finally, as shown in FIG. 18A and FIG. 18B, after the barrier metal 17 and the aluminum film 18 as wiring materials are deposited sequentially on the entire face of the substrate S including the recessed contact holes, the wiring layer is formed by patterning the barrier metal 17 and the aluminum film 18, thereby completing the semiconductor device. Wherein, the wiring layer is in electrical contact with the source region 15 and the second body region 13 at parts of the wall faces of the trenches while being in electric contact with the third body region 16 at the upper face of the third body region 16.

What is clamed is:

1. A vertical gate semiconductor device, comprising:
   a first conductivity type drain region formed on a substrate;
   a second conductivity type first body region provided on the drain region;
   a trench formed so as to pass through the first body region;
   a gate electrode formed in the trench with a gate insulting film interposed so as to form a recessed portion at an upper part of the trench;
   an insulating film formed on the gate electrode so as to occupy the recessed portion partway;
   a first conductivity type source region formed in at least a region of an upper part of the first body region which serves as a wall part of the trench so as to overlap in level with at least an upper part of the gate electrode;
   a second conductivity type second body region formed in a region of the upper part of the first body region other than the at least region thereof so as to be adjacent to the source region in a direction that the trench extends;
   a second conductivity type third body region formed in respective upper parts of the source region and the second body region; and
   a wiring layer in contact with the source region, the second body region, and the third body region.

2. The vertical gate semiconductor device of claim 1, wherein the source region, the second body region, and the third body region reach a wall face of the trench, the upper face of the insulating film is lower than respective upper faces of the source region and the second body region, and
   the wiring layer is formed so as to cover the upper face of the third body region and a part of the wall face of the trench which is upper in level than the insulating film, at which the wiring layer is in contact with the source region, the second body region, and the third body region.

3. The vertical gate semiconductor device of claim 1, wherein the upper corner of the wall part of the trench is rounded.

4. The vertical gate semiconductor device of claim 1, further comprising:
   an additional trench passing through the first body region and formed in parallel with the trench,
   wherein the source region, the second body region, and the third body region are formed between the trench and the additional trench, and
   between the trench and the additional trench, a layered structure formed of the source region and the third body region and a layered structure formed of the second body region and the third body region each have a convex form of which top is rounded.

5. The vertical gate semiconductor device of claim 1, wherein the third body region covers a part of the source region other than a part thereof in contact with the wiring layer.

6. The vertical gate semiconductor device of claim 1, wherein the source region and the wiring layer are in contact with each other at the wall face of the trench.

7. The vertical gate semiconductor device of claim 1, Wherein the second body region and the wiring layer are in contact with each other at the wall face of the trench, and
   the third body region and the wiring layer are in contact with each other at the upper face of the third body region.

8. The vertical gate semiconductor device of claim 1, wherein a breakdown voltage of the drain region is in a range between 8 V and 100V, both inclusive.

* * * * *